(12) United States Patent
Katkar et al.

(10) Patent No.: US 10,354,945 B2
(45) Date of Patent: Jul. 16, 2019

(54) MULTI-SURFACE EDGE PADS FOR VERTICAL MOUNT PACKAGES AND METHODS OF MAKING PACKAGE STACKS

(71) Applicant: Invensas Corporation, San Jose, CA (US)

(72) Inventors: Rajesh Katkar, Milpitas, CA (US); Min Tao, San Jose, CA (US); Javier A. Delacruz, San Jose, CA (US); Hoki Kim, Santa Clara, CA (US); Akash Agrawal, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 23 days.

(21) Appl. No.: 15/660,718

(22) Filed: Jul. 26, 2017

(65) Prior Publication Data

US 2018/0040544 A1 Feb. 8, 2018

Related U.S. Application Data

(60) Provisional application No. 62/372,101, filed on Aug. 8, 2016.

(51) Int. Cl.
*H05K 1/11* (2006.01)
*H05K 1/14* (2006.01)
(Continued)

(52) U.S. Cl.
CPC .... *H01L 23/49805* (2013.01); *H01L 21/4803* (2013.01); *H01L 21/4846* (2013.01); *H01L 21/4853* (2013.01); *H01L 23/49833* (2013.01); *H01L 25/105* (2013.01); *H05K 1/117* (2013.01); *H05K 1/181* (2013.01); *H05K 3/3405* (2013.01); *H01L 23/13* (2013.01); *H01L 24/48* (2013.01);
(Continued)

(58) Field of Classification Search
CPC ........... H05K 2201/09745; H01L 2924/15159; H01L 2224/48225
See application file for complete search history.

(56) References Cited

U.S. PATENT DOCUMENTS 6,147,411 A * 11/2000 Kinsman ............. H01L 25/0657
257/777
2001/0032388 A1* 10/2001 Morris ................... H05K 1/112
29/852

(Continued)

*Primary Examiner* — Marc Anthony Armand

(57) ABSTRACT

Multi-surface edge pads for vertical mount packages and methods of making package stacks are provided. Example substrates for vertical surface mount to a motherboard have multi-surface edge pads. The vertical mount substrates may be those of a laminate-based FlipNAND. The multi-surface edge pads have cutouts or recesses that expose more surfaces and more surface area of the substrate for bonding with the motherboard. The cutouts in the edge pads allow more solder to be used between the attachment surface of the substrate and the motherboard. The placement and geometry of the resulting solder joint is stronger and has less internal stress than conventional solder joints for vertical mounting. In an example process, blind holes can be drilled into a thickness of a substrate, and the blind holes plated with metal. The substrate can be cut in half though the plated holes to provide two substrates with plated multi-surface edge pads including the cutouts for mounting to the motherboard.

14 Claims, 11 Drawing Sheets

(51) Int. Cl.
  *H05K 1/18*  (2006.01)
  *H05K 3/34*  (2006.01)
  *H05K 3/36*  (2006.01)
  *H01L 21/48*  (2006.01)
  *H01L 23/00*  (2006.01)
  *H01L 23/13*  (2006.01)
  *H01L 25/10*  (2006.01)
  *H01L 23/498*  (2006.01)

(52) U.S. Cl.
  CPC ............ *H01L 2224/48105* (2013.01); *H01L 2224/48225* (2013.01); *H01L 2225/107* (2013.01); *H01L 2225/1064* (2013.01); *H01L 2924/15159* (2013.01); *H01L 2924/15162* (2013.01); *H01L 2924/15172* (2013.01); *H01L 2924/15331* (2013.01); *H01L 2924/15333* (2013.01); *H05K 1/141* (2013.01); *H05K 1/144* (2013.01); *H05K 3/366* (2013.01); *H05K 2201/049* (2013.01); *H05K 2201/09472* (2013.01); *H05K 2201/09745* (2013.01); *H05K 2201/09845* (2013.01); *H05K 2201/10159* (2013.01); *H05K 2201/10522* (2013.01)

(56) References Cited

U.S. PATENT DOCUMENTS

| | | | |
|---|---|---|---|
| 2004/0214466 A1 | 10/2004 | Lin | |
| 2010/0018757 A1 | 1/2010 | Banzo | |
| 2011/0026232 A1* | 2/2011 | Lin | ............... H01L 21/76898 |
| | | | 361/760 |
| 2018/0012864 A1* | 1/2018 | Brunschwiler | ..... H01L 25/0655 |

* cited by examiner

MULTI-SURFACE EDGE PADS FOR VERTICAL MOUNT PACKAGES AND METHODS OF MAKING PACKAGE STACKS

CROSS-REFERENCE TO RELATED APPLICATION(S)

This patent application claims the benefit of priority to U.S. Provisional Patent Application No. 62/372,101, filed Aug. 8, 2016, and is incorporated herein by reference in its entirety.

BACKGROUND

In substrate design, edge pads are planar metal contacts at the edge of a substrate for attaching the substrate to a motherboard. Mounting the substrate to the motherboard involves soldering the edge pads to metal pads on the motherboard. The conventional soldering of the edge pads forms a characteristic solder joint attaching the vertical edge pads to horizontal pads on the motherboard. However, the solder joints are adjacent to the attachment edge of the substrate, but not underneath the attachment edge, and are not directly between the attachment edge of the substrate and the motherboard. Since these conventional solder joints are off-to-the-side of the actual surfaces being joined, these conventional solder joints have reliability concerns.

SUMMARY

Multi-surface edge pads for vertical mount packages and methods of making package stacks are provided. Example substrates for vertical surface mount to a motherboard have multi-surface edge pads. The vertical mount substrates may be those of a laminate-based FlipNAND. The multi-surface edge pads have cutouts or recesses that expose more surfaces and more surface area of the substrate for bonding with the motherboard. The cutouts in the edge pads allow more solder to be used between the attachment surface of the substrate and the motherboard. The placement and geometry of the resulting solder joint is stronger and has less internal stress than conventional solder joints for vertical mounting. In an example process, blind holes can be drilled into a thickness of a substrate, and the blind holes plated with metal. The substrate can be cut in half though the plated holes to provide two substrates with plated multi-surface edge pads including the cutouts for mounting to the motherboard.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DETAILED DESCRIPTION

This disclosure describes example multi-surface edge pads for vertical mount packages and methods for making package stacks that include the multi-surface edge pads.

Figure 1:
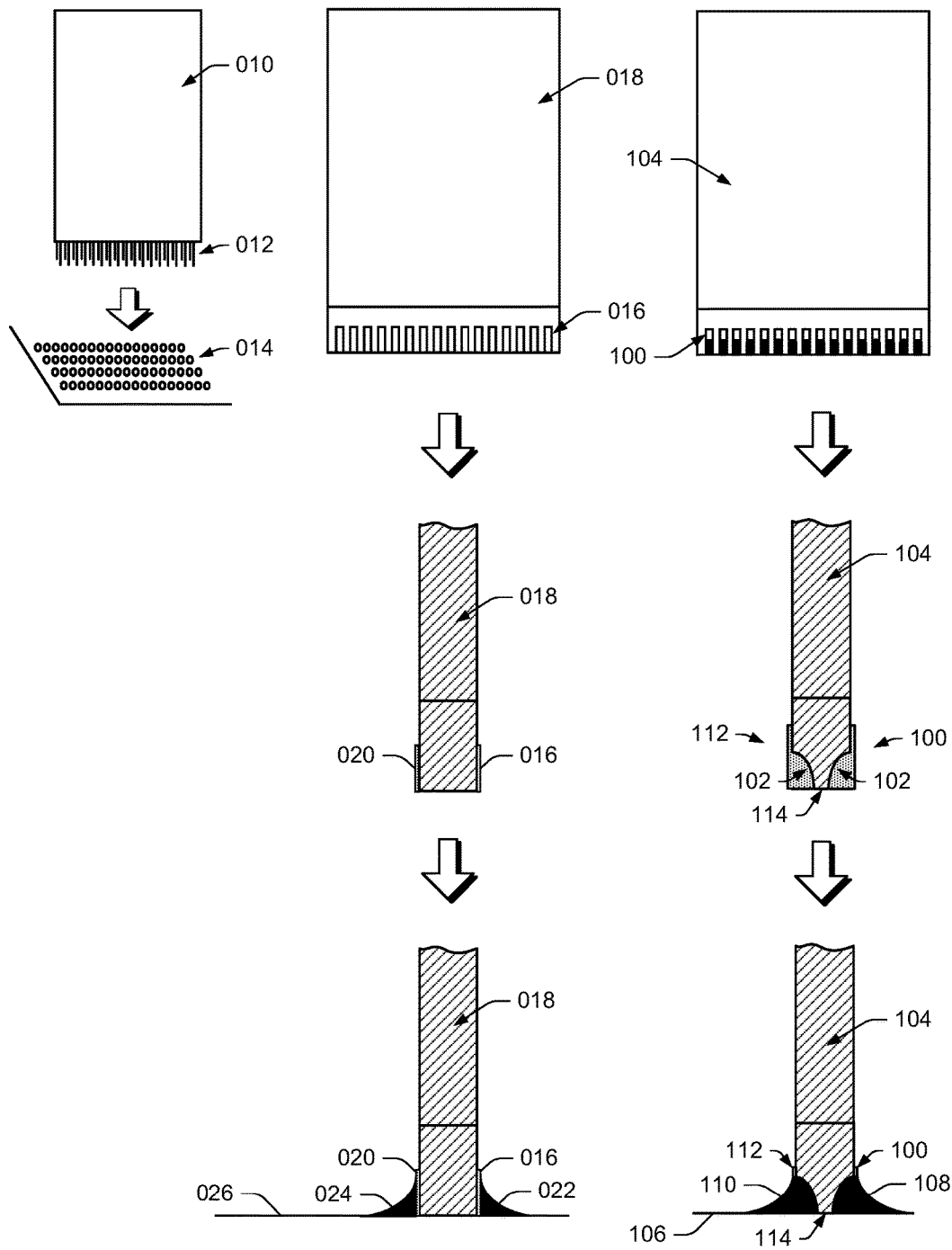
FIG. 1 is a diagram of example multi-surface edge pads with cutouts, on a vertical mount substrate.

In conventional substrate design, vertical attachment to a motherboard may take various forms. FIG. 1 shows a comparison of conventional edge pads for vertical mount packages versus example multi-surface edge pads to be described herein. In conventional surface mount technology (SMT), a conventional leadframe based FlipNAND 010, for example, has multiple pins 012 projecting from one edge of the conventional FlipNAND 010 for attachment to the motherboard 014. These pins 012 often provide good solder joint reliability. But pins of this type provide only a limited pin count that may not support more advanced NAND interfaces, such as DDR2/3, dual/quad 8×, and so forth.

For conventional laminate-based FlipNAND, conventional edge pads 016 are planar metal contacts at the edge of a substrate 018 for attaching the substrate to a motherboard. Mounting the substrate to the motherboard conventionally involves soldering the edge pads 016 to metal pads on the motherboard. Each vertical edge pad 016 on the substrate 018 has a single metal surface to which solder may first be wetted, and then applied in volume for mounting the substrate 018 to the motherboard. Most often there are conventional edge pads 016 & 020 on both sides of the substrate 018 at the same mounting edge, providing a higher count of these edge pads 016 & 020 for more electrical connections to support more advanced NAND interfaces. However, the simple single surfaces of each edge pad 016 & 020, when soldered perpendicularly to respective horizontal pads on the motherboard 026, result in conventional solder joints 022 & 024 that may have the above-introduced solder joint reliability (SJR) concerns.

Example multi-surface edge pads 100 described herein, on the other hand, have recessed cutouts 102 providing multi-surface contacts pads 100 for surface mount technology. The cutouts 102 may also be referred to as notches, recesses, divots, indents, blind holes, and so forth. Each multi-surface contact pad 100 provides multiple surfaces at different orientations from each other within the cutout for solder attachment between the substrate 104 and a motherboard 106.

Each cutout 102 associated with a multi-surface edge pad 100 provides multiple improvements over conventional solder joints 022 used in vertical surface mount technology. Each multi-surface edge pad 100 with a cutout 102 provides for greater volumes of solder 108 & 110 to be used to bond edge pads 100 & 112 and substrate 104 to the motherboard 106. The multi-surface edge pads 100 with cutouts 102 also provide more additional surfaces for the solder to bond to, and also more overall surface area for the solder 108 to bond to between the substrate 104 and motherboard 106.

Each multi-surface edge pad 100 with cutout 102 also provides a solder joint with stronger geometry, and with lower internal stress, than the conventional solder geometry 022.

Finally, the multi-surface edge pad 100 with cutout 102 also provides at least some soldering surface that is parallel to the surface of the motherboard 106 for a stronger bond, instead of the entire surface of the edge pad 016 being perpendicular to the motherboard 106, as in conventional solder joints 022. For example, if the motherboard 106 is horizontal, then the example multi-surface edge pad 100 with cutout 102 provides either an outright horizontal soldering surface parallel to the motherboard 106 within the cutout 102, or provides at least a horizontal aspect or horizontal segment of a rounded or arched surface that is parallel to the motherboard 106 for at least a part of the rounded or arched cutout 102. The presence of a parallel horizontal surface or a parallel horizontal aspect of a rounded surface results in a solder bond between or "under" the attachment edge 114 of the substrate 104 and (over) the motherboard 106, providing a solder bond directly between the attachment edge 114 of the substrate 104 and the motherboard 106, instead of just a conventional solder bond 022 that is adjacent to an attachment edge of a vertical substrate 018.

FIG. 1 thus shows an example substrate 104 described herein with enlarged, multi-surface, multi-contacting edge pads 100 for attachment to the motherboard 106. In an implementation, a laminate-based FlipNAND package may have edge pads 100 & 112 on one or more vertical sides of the substrate 104 with a recess, indent, blind hole, or cut-out 102, for example, at the edge of each pad 100. The recess 102 in each edge pad 100 creates a multi-surface edge pad 100 with more surfaces and more surface area than conventional edge pads. The multi-surface edge pad 100 thus provides more surfaces and more surface area for more solder to bond to. The increased amount of solder contacts more surfaces and more surface area of the multi-surface edge pad 100 as compared with conventional edge pads 016, for surface-mounting the substrate 104 to the motherboard 106.

In an implementation, an example method adopts plated-hole manufacturing techniques as part of a process for creating multi-surface edge pads for vertical mount. In other implementations, other methods and processes may be used to create the example multi-surface edge pads.

Figure 2:
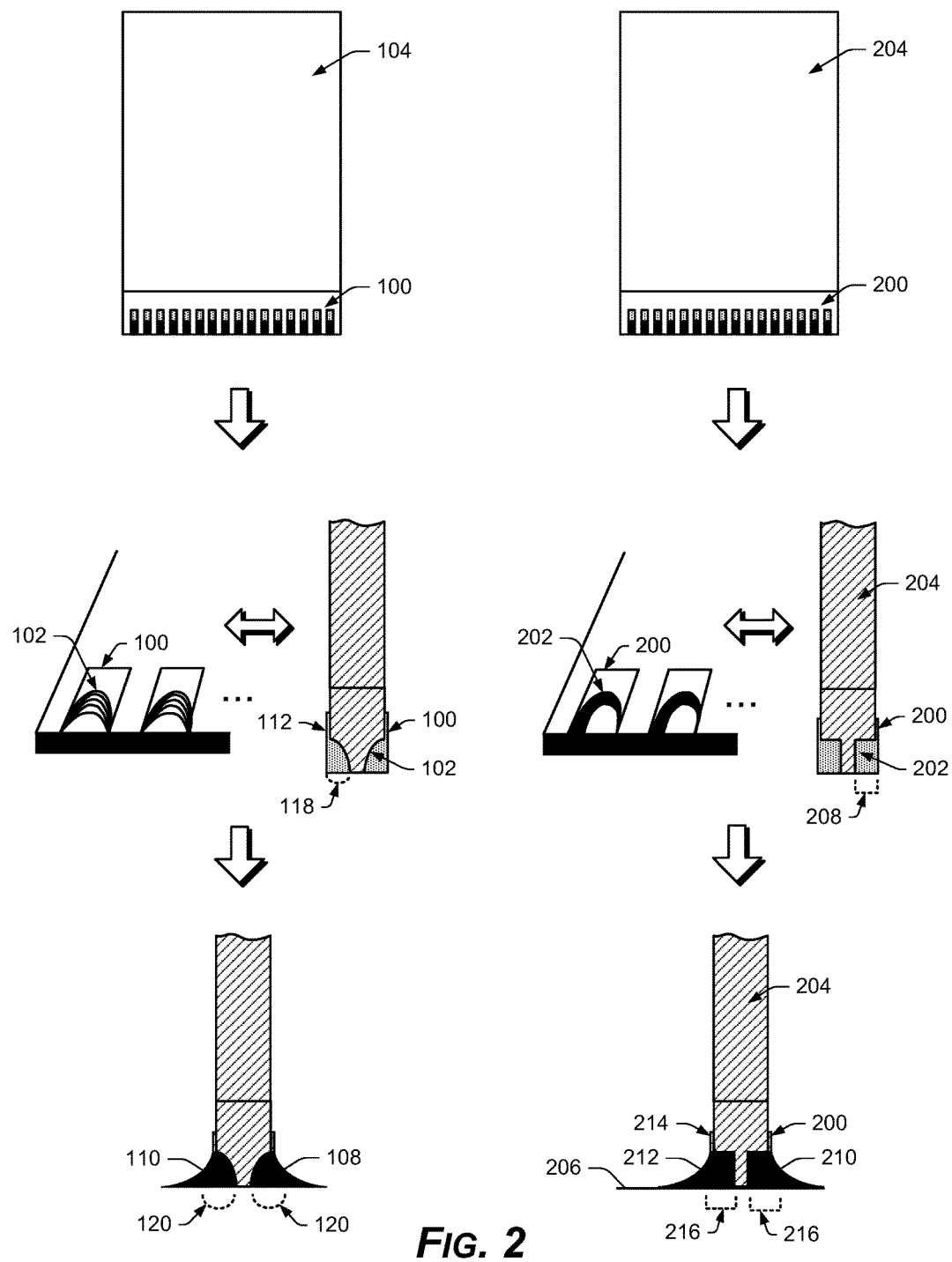
FIG. 2 is a diagram of different shape profiles of the example multi-surface edge pads with cutouts.

FIG. 2 shows two example implementations of multi-surface edge pads 100 with cutouts 102 & 202. The cutout 102, shown in both FIGS. 1 and 2, has a rounded spoon-like 3-dimensional shape profile that slopes as the cutout 102 gets deeper. The rounded spoon-like profile of the example cutout 102 provides a rounded cross-sectional profile 118 for the cutout 102. Likewise, the solder joints 108 and 110 on the respective multi-surface edge pads 100 & 112 have a corresponding rounded cross-sectional profile 120.

A second implementation of the multi-surface edge pad 200 with cutout 202 secures another example substrate 204 to a motherboard 206. The example cutout 202 has an arched shape profile in 3-dimensions with straight non-rounded sides in the depth dimension. The arched shape profile provides a rectangular or square cross-sectional profile 208 for the cutout 202. Likewise, the solder joints 210 & 212 on the respective multi-surface edge pads 200 & 214 have a rectangular or square cross-sectional profile 216.

Figure 3:
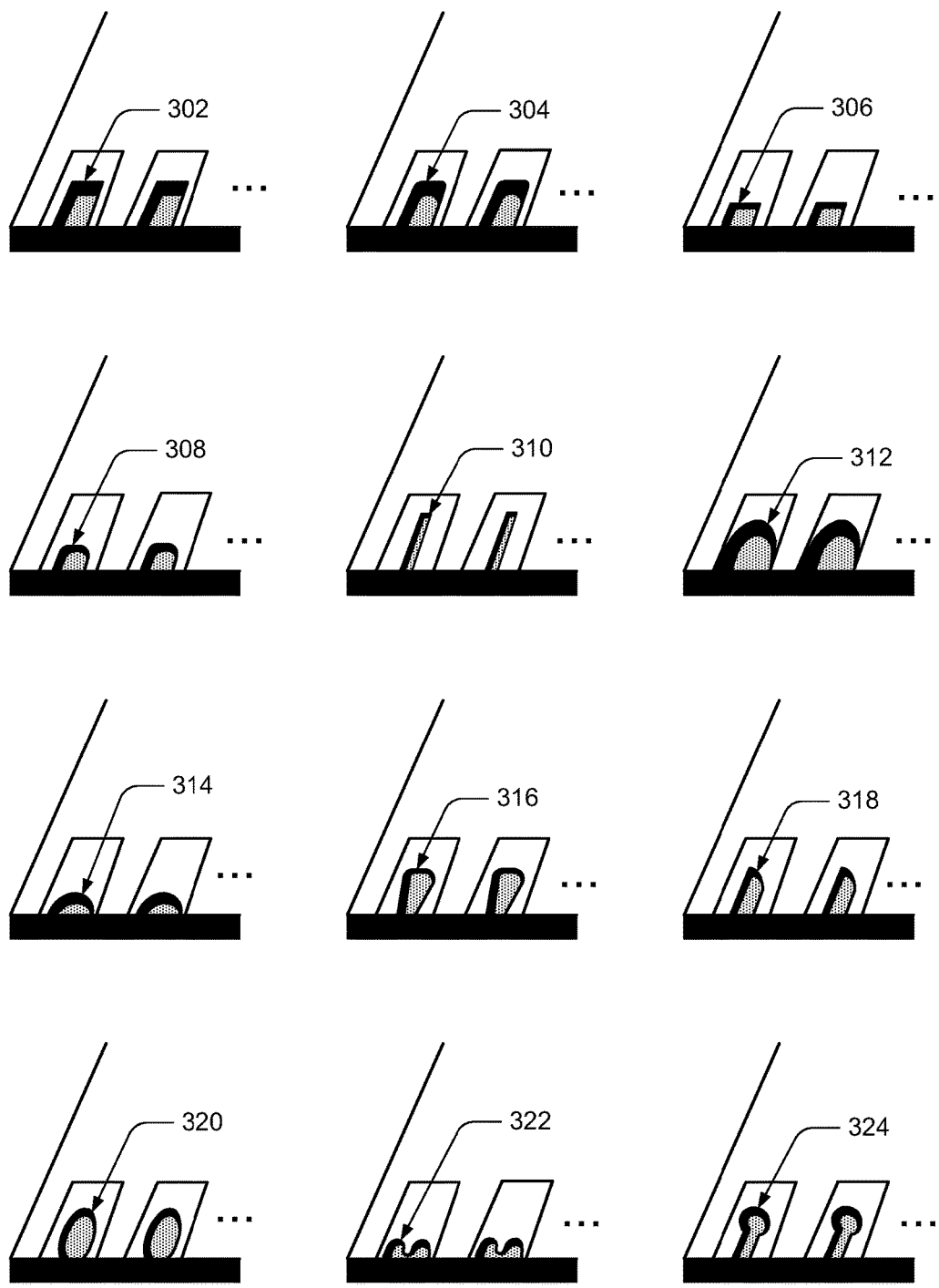
FIG. 3 is a diagram of additional shape profiles of the multi-surface edge pads with cutouts.

FIG. 3 shows further example cutout shapes for the multi-surface edge pads 100 with cutouts. For example, a given cutout shape may be a rectangle 302, a rectangle with at least two rounded corners 304, a square 306, a square with at least two rounded corners 308, a trough 310, an arch 312, a semicircle 314, a rounded triangle 316, a half-moon 318, a semi-oval 320, a horizontal dumbbell 322, or a vertical dumbbell 324. Moreover, different cutout shapes may be used on different multi-surface edge pads 100 on the same substrate 104.

The 3-dimensional shape of the space or volume created by the particular cutout 102 or "recess" may have smooth rounded surfaces within the cutout 102, for example when the cutout 102 is created by a rounded drill end, by scooping, or by etching, or the space or volume may have sharp edges and corners, as when the cutout 202 is created by punching or a drill bit that penetrates, for example. The space or volume of a given cutout 102 may be a rectangular prism, a rectangle prism with at least two rounded edges or corners, a cube, a cube with at least two rounded edges or corners, an arched shape, semicircular shape, a trough shape, an ovaline shape, a semi-ovaline shape, an ellipsoid shape, a conic shape, a triangular shape, or a dumbbell shape, for example. Creation of the example multi-surface edge pads 100 using a plated blind hole manufacturing processes makes the multi-surface edge pads 100, in which the blind holes are the cutouts 102. The cutouts 102 are then metalized for solder wetting and vertical interconnector mounting.

In an example implementation, an apparatus includes a substrate, a first surface of the substrate for mounting an electronic component or an electronic circuit, a second surface of the substrate for mounting the substrate to a motherboard or to a second substrate, a cutout or notch in the substrate at an edge, a corner, or an intersection between the first surface and the second surface, a metal adhered or bonded to at least a part of the cutout or notch and electrically coupled to the electronic component or the electronic circuit, and a solder in the notch attaching the substrate to the motherboard or to the second substrate.

In the example apparatus, the notch may expose or create at least one additional surface of the substrate, and the solder attaches the at least one additional surface of the substrate to the motherboard or to the above-mentioned other, second substrate.

For example, the first surface of the substrate can be vertical with respect to a horizontal motherboard. The second surface is then parallel to the horizontal motherboard. Then the notch exposes or creates at least one additional horizontal surface or additional horizontal component of a surface of the substrate, and the solder forms an attachment of the additional horizontal surface or the additional horizontal component of a surface of the substrate to the horizontal motherboard, and the attachment is within a horizontal cross-section of the substrate, that is, underneath the attachment edge of the substrate, or between the attachment edge and the motherboard.

In an implementation, the notch may be a recess in at least the first surface of the substrate, and the solder is disposed in at least the recess to attach the substrate to the motherboard or to the second substrate. The notch may also be a recess in both the first surface of the substrate and the second surface of the substrate. The solder is then disposed in at least this recess to attach the substrate to the motherboard or to the second substrate.

The electronic component attached to the first (vertical) surface may be a die, a chip, a semiconductor, or a discrete component. The above-mentioned electronic circuit may be an electrical connector, a lead, a line, a wire, or a printed circuit.

Figure 4:
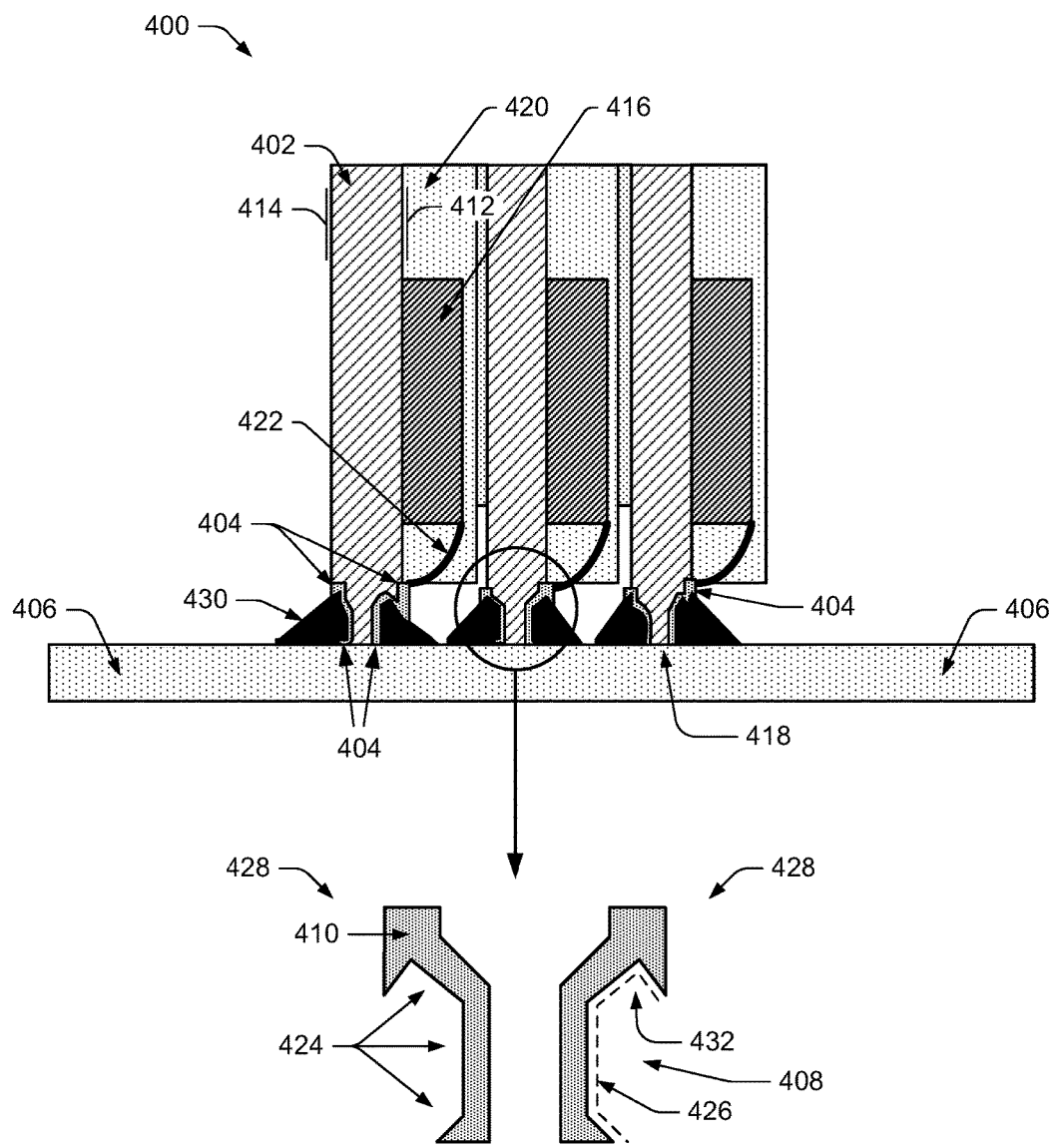
FIG. 4 is a diagram of an example laminate-based FlipNAND package utilizing the multi-surface edge pads with cutouts.

As shown in FIG. 4, in an example apparatus 400, the substrates 402 may be components of a laminate-based chip package 400 with dual-side vertical contact pads 404 for mounting to the motherboard 406. Instances of the notch, cutout, or recess 408 are created on at least some of the vertical contact pads 404, and each instance of the recess 408 may be plated with metal 410 and (optionally) electrically connected to the respective vertical contact pad 404. In an implementation, the example apparatus 400 is a laminate-based chip package providing a FlipNAND memory array.

In an implementation, the example laminate-based chip package 400 may have an organic or inorganic core substrate 402, first and second vertical surfaces 412 & 414 of the core substrate 402 for mounting die 416 or chips, a horizontal surface of an edge 418 of the core substrate 402 for mounting to the motherboard 406, and die 416 or chips adhered or bonded to the first and second vertical surfaces 412 & 414 of the core substrate 402. A dielectric 420 may be laminated on the die 416 or chips and the core substrate 402.

The electrical contact pads 404 on the first and second vertical surfaces 412 & 414 of the core substrate 402 are for electrically connecting to the motherboard 406 at the edge of the core substrate 402. At least an electrical connection 422 may exist between the die 416 or chips and at least some of the respective electrical contact pads 404 on each side of the laminate-based chip package 400. The multiple recesses 408 each constitute a space formed in the electrical contact pads 404 into the core substrate 402 at a depth, each recess 408 providing additional surfaces 424 and additional surface area 426 of the core substrate 402 for bonding to the motherboard 406. The recesses 408 are metalized 410 for soldering and for electrically connecting with respective electrical contact pads 404. Each instance of the recess 408 that is formed into the core substrate 402, at a location of a corresponding electrical contact pad 404 at the edge of the core substrate 402, constitutes a multi-surface edge pad 428. Solder 430 is then bonded to the metalized recesses 408, the solder 430 forming a solder joint 500 in at least each of the recesses 408 to connect the additional surfaces 424 and the additional surface area 426 of each multi-surface edge pad 428 to the motherboard 406.

The example laminate-based chip package 400 may have a core substrate 402 with a thickness between approximately 50-500μ (microns). The laminate-based chip package 400 may have a plurality of laminate layers of the core substrate 402, each laminate layer including sets of the multi-surface edge pads 428 comprising the recesses 408 for joining the plurality of laminate layers to the motherboard 406. Each laminate layer may have a thickness of approximately 20-25μ (microns), and the plurality of laminate layers may have a total thickness of approximately 100-200μ (microns) for bismaleimide-triazine resin (BT) materials, and approximately 200-800μ (microns) for printed circuit board (PCB) materials.

The solder 430 may be disposed under a horizontal surface or an overhang 432 of each multi-surface edge pad 428 and above a horizontal surface of the motherboard 406. The example laminate-based chip package 400 may also include an underfill disposed under or around some surfaces of the substrate 402. In some cases, the solder 430 may be a subset of possible underfills.

Figure 5:
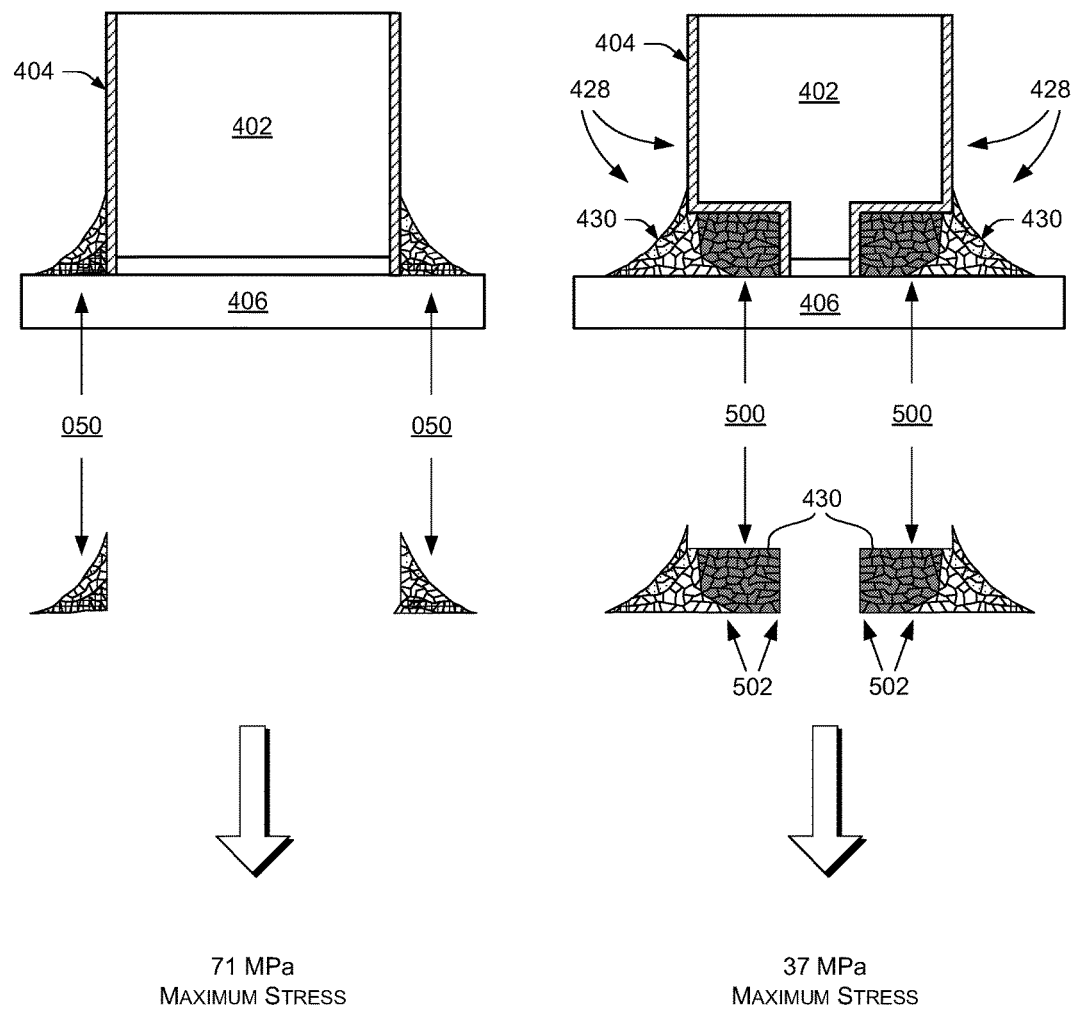
FIG. 5 is a diagram comparing the high-strength and low stress solder joints of the multi-surface edge pads with conventional solder joints for vertical surface mount technology.

As shown in FIG. 5, a conventional solder joint 050 for vertical surface mount technology uses a certain average amount of solder in a conventional characteristic solder joint with triangular profile that sits adjacent to the actual surface being joined to the motherboard 406. By comparison, in the example multi-surface edge pad 428 with recess or cutout 408, the amount of the solder 430 in the solder joint 500 and the geometrical configuration of the solder 430 in each solder joint 500 of a multi-surface edge pad 428 with cutout 408 can reduces the stress, and greatly increase the strength of the solder joints 500. For example, the example solder joint 500 may reduce the stress of the solder joint 500 by approximately 50% over a conventional solder joint 050 for vertical surface mount technology. In an example, the conventional solder joint 050 has a stress of 71 MPa, while the example multi-surface pad 428 solder joint 500 has a stress of only 37 MPa. It is worth noting that the entire region of extra solder 502 directly under the mounting surface of the substrate 402 not only attaches the substrate 402 directly to the motherboard 406, but also experiences extremely low internal stress forces. Moreover, the extra solder 430 in the region of extra solder 502 attaches the substrate 402 to the motherboard 406 by bonding additional surfaces of the metal contact (e.g., copper) pad 404 at favorable geometries and orientations.

Figure 6:
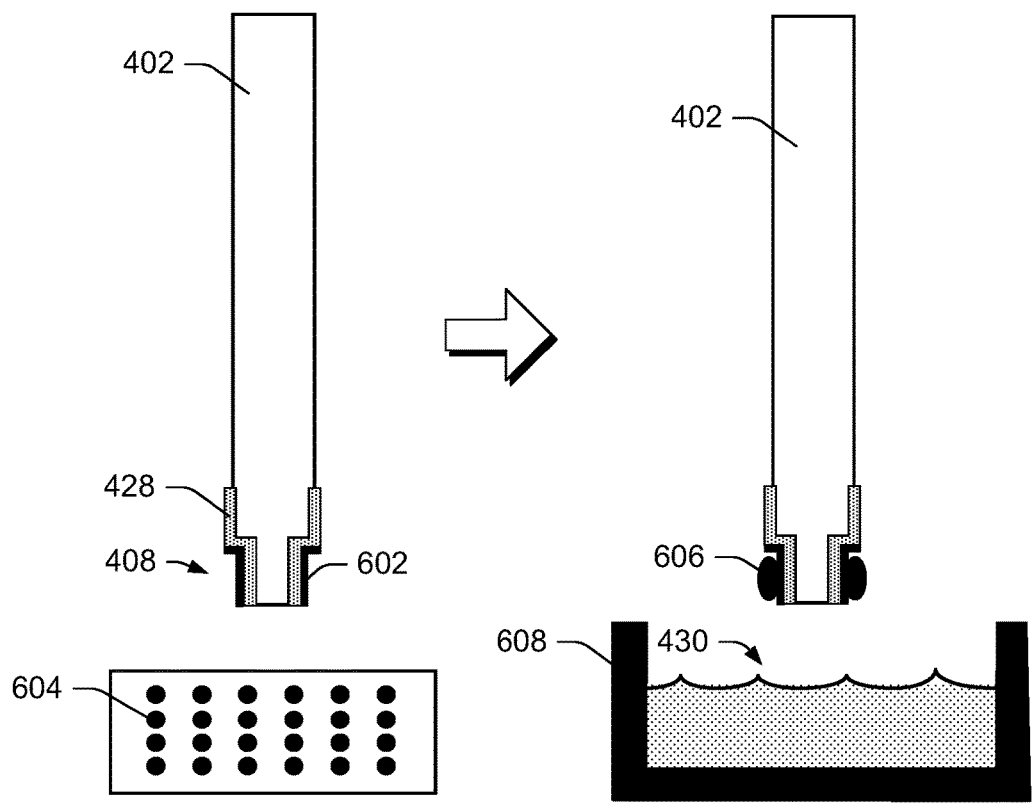
FIG. 6 is a diagram of solder wetting and dipping techniques to achieve a volume of solder or solder balls in recessed cutouts of the multi-surface edge pads.

As shown in FIG. 6, the example laminate-based chip package 400 may have a first dipped layer 602 of the solder 430, initially applied to wet the multi-surface edge pads 428, and later a flowed solder 604 to add a volume of solder 430 to the solder joint 500. The flowed solder 604 may be provided by solder balls 604 on ball grid array endpoints of the motherboard 406. Bulked up solder or onboard solder balls 606 may also be formed in the recessed holes formed by the cutouts 408 of the multi-surface edge pads 428 by dipping the multi-surface edge pads 428 with cutouts 408 in a tank 608 of molten solder 430. Solder 430 may also be printed onto the core substrate 402.

Figure 7:
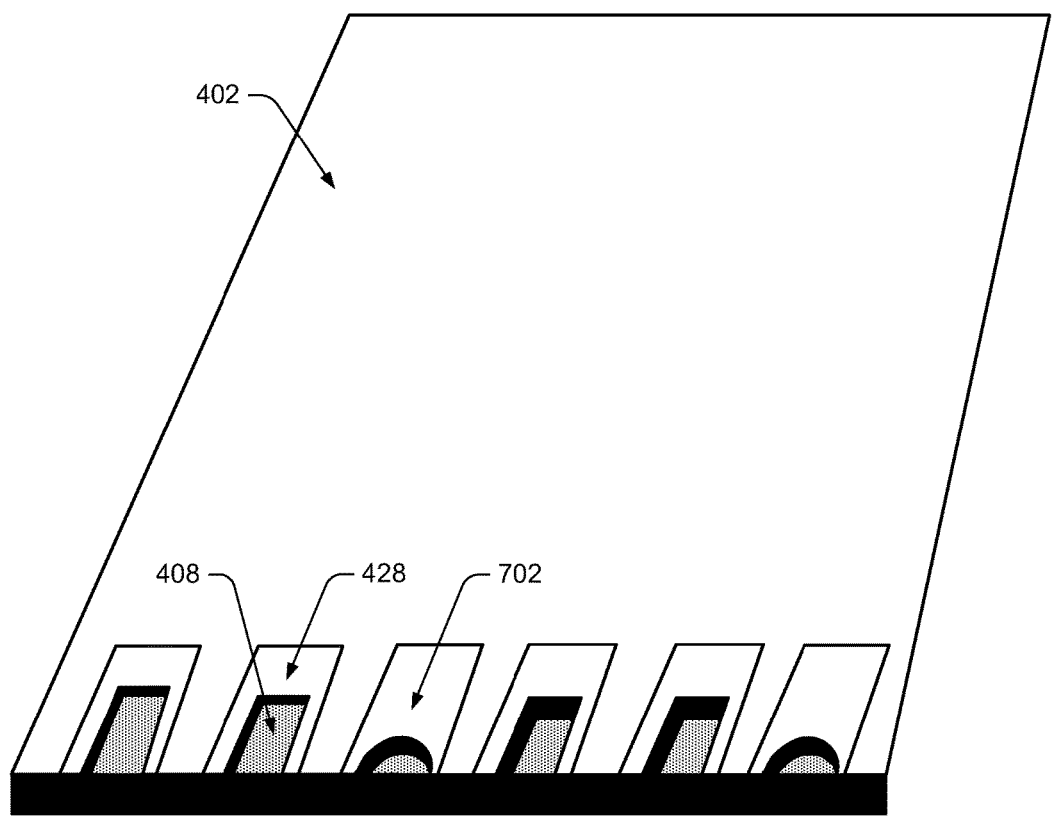
FIG. 7 is a diagram of an example substrate with multi-surface edge pads that have cutouts of different shapes, depths, and offsets.

FIG. 7 shows an example substrate 402 in which least some of the multi-surface edge pads 428 with recesses 408 have different shapes from each other (e.g., shape 702) and/or have different offsets, or different depths from a front surface of each substrate 402.

The recesses or cutouts 408 may be created on each of two vertical sides 412 & 414 of the core substrate at a mounting edge of the core substrate to provide dual-side multi-surface edge pads 428 on the core substrate 402. The solder 430 is applied to the metalized recesses 408 on the two vertical sides 412 & 414 of the core substrate 402, and an electrical connection may ultimately be formed by the soldering between one or more electronic components 416 or circuits on respective vertical surfaces 412 & 414 of the substrate 402 and respective endpoints on the motherboard 406, on either side of the substrate 402, with the multi-surface edge pads 428 intervening between the electronic components 416 and the motherboard 406. Through-substrate-vias may also be used through the thicknesses of the laminate layers to electrically couple electronic components on opposite sides of a substrate 402 or laminate layer.

Figure 8:
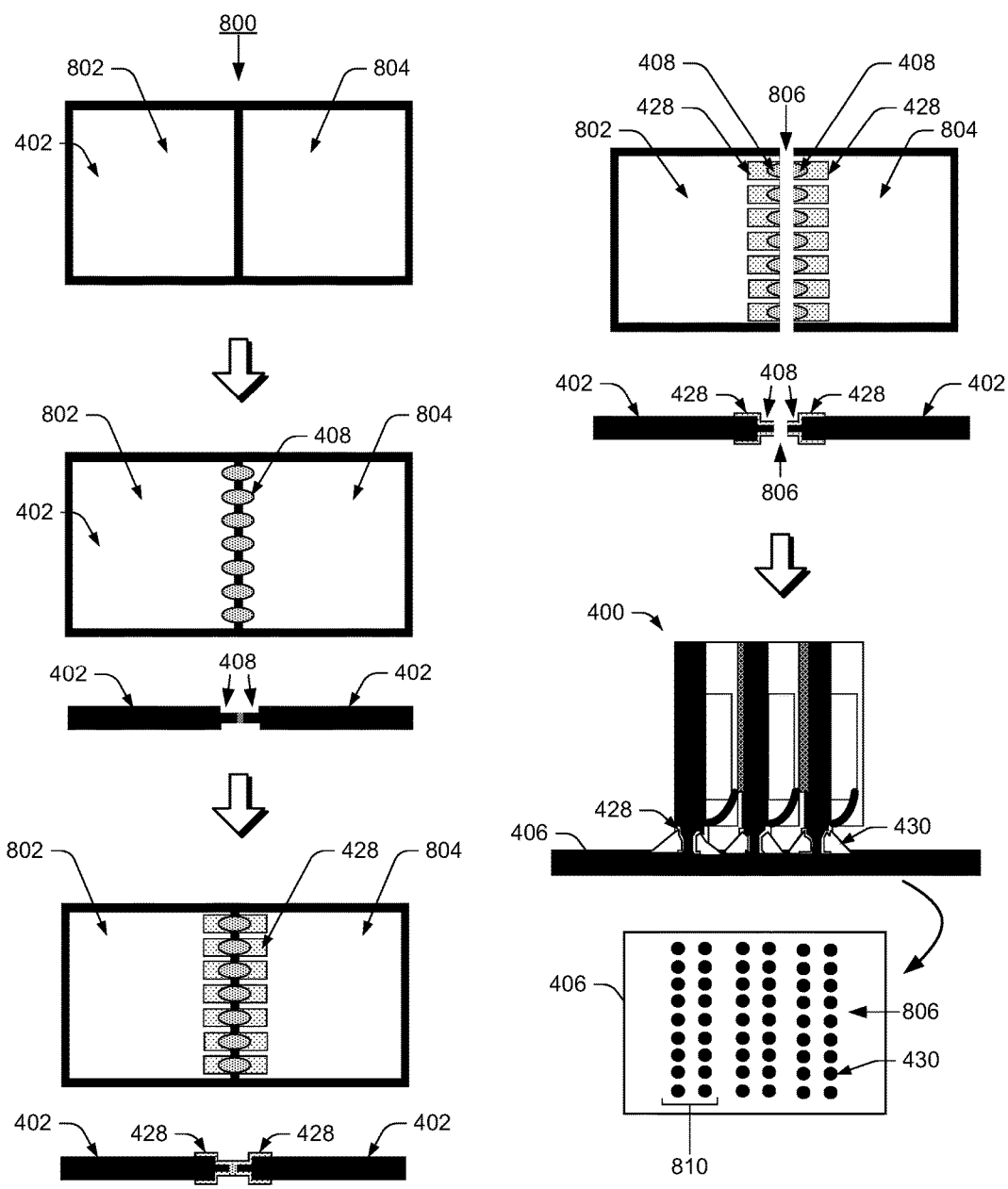
FIG. 8 is a diagram of an example construction process for making substrates with the multi-surface edge pads with cutouts.

FIG. 8 shows an example construction process 800 for creating the multi-surface edge pads 428 with cutouts 408 on substrates 402. In an implementation, part of substrate strip has two adjacent substrates 802 & 804 that mirror each other. Recesses or cutouts 408 are created at the joining line between the two adjacent substrates 802 & 804, for example by drilling blind holes at a selected depth to be the cutouts 408. Besides drilling in general, the cutouts 408 may also be created by punching, end-drilling, laser-drilling, sand blasting, cutting, etching, plasma etching, for example, the recesses or cutouts 408 in the substrates 402. The cutouts 408 may be created on both (front and back) sides of the conjoined substrate parts 802 & 804. The creation of cutouts 408 can be performed during a PCB process at the individual top and bottom layers before pressing multiple layers together, for example. The blind holes constituting the cutouts 408 can then be seeded and plated while also plating to make the metal (e.g., copper) multi-surface edge pads 428.

The conjoined substrate parts 802 & 804 are then cut apart (singulated) at their midline 806. This results in two identical substrate instances 402, each with plated multi-surface edge pads 428 with cutouts 408. A board side solder ball pattern 808 corresponds to the individual 2-column endpoints 810 to which each substrate 402 with multi-surface edge pads 428 in a laminated stack 400 of substrates 402 connects to.

Figure 9:
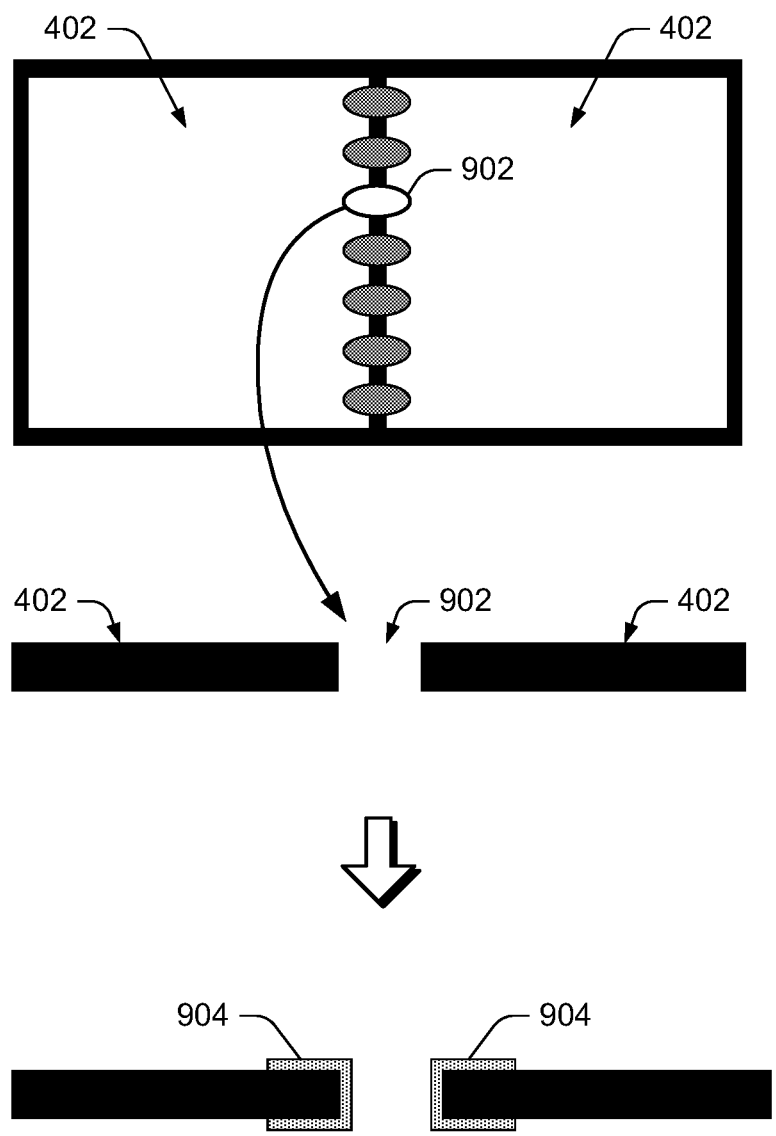
FIG. 9 is a diagram of plated through-holes used with the multi-surface edge pads with cutouts.

FIG. 9 shows example substrates 402 further including through-holes 902 at a multi-surface edge pad 428, the through-holes 902 created through the substrates 402 at mounting edges of the substrates 402. A layer of metal 904 is deposited or plated on surfaces of the through-holes 902 to make metalized through-holes 902, which can also electrically connect electronic components 416 or circuits together on each vertical side of each substrate 402. Solder 430 can then be applied to the metalized through-hole 902 for soldering the substrate 402 to the motherboard 406, and for electrical connection to a circuit on the motherboard 406.

In FIG. 9, the substrates 402 can be cut and singulated into two instances of a substrate 402, each with a through-hole 902. Such through-holes 902 can be useful for soldering the substrate 402 to the motherboard 406 and for electrically connecting components on both vertical sides of the substrate 402 to common signals, common power sources, or common voltage states. For example, a through-hole 902 can electrically connect circuits on both (front and back) sides of the substrate 402 to a common power source circuit, common ground circuit or planes, or a common signal circuit of the motherboard 406.

The through-hole 902 may thus serve as a connected "via" through a thickness of the substrate 402 for connecting front components on a first vertical side of the substrate 402 with back components on a second vertical side of the substrate 402. The "opposite side" components may include an electrical connector, circuit, ground plane, power plane, coil, inductor, filter, capacitor plate, antenna, or interference shield, for example, connected across sides through a thickness of the substrate 402 via the metalized through-hole 902.

The metal-plated through-holes 902 reduce the overall pin or pad count by half, but provide a benefit of electrical connection to both vertical sides of the substrate 402 to common circuits or ground planes on the motherboard 406, and increased contact surfaces 424 and surface area 426 for solder 430, thereby creating stronger solder joints 500.

Figure 10:
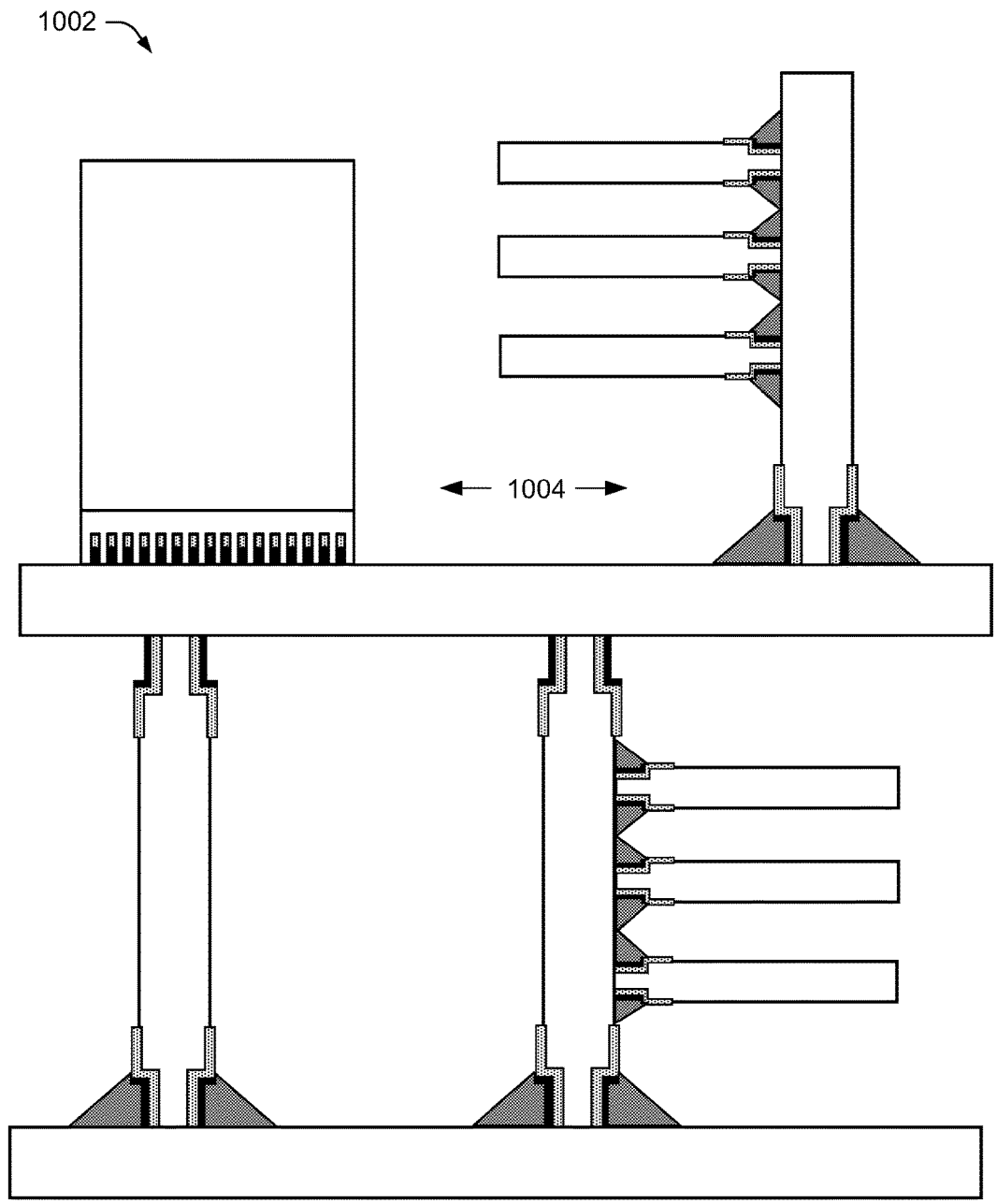
FIG. 10 is a diagram of the example multi-surface edge pads disposed on multiple edges of a substrates for complex mounting and high density sub-arrangements in multiple orientations.

FIG. 10 shows example multi-surface edge pads 428 with cutouts 408 on multiple mounting edges of the substrates 402. The stronger solder joints 500 provided by the example multi-surface edge pads 428 with cutouts 408 allows conjugated "vertical" surface mounting, or perpendicular mounting, in which conjugate mounts form more complex 3-dimensional (3D) structures with reliable strength between joined surfaces. So instead of substrates 402 being mounted solely to a main board or motherboard 406, multiple substrates 402 can be mounted to each other in more complex structures 1002 or subassemblies 1004 to accommodate higher density of component within a package. A laminate-based chip package, for example, may include the multi-surface edge pads 428 formed on one or more vertical sides of substrate 402 at multiple mounting edges of the substrate 402, with the solder 430 attaching the multiple mounting edges to one or more motherboards 406 or multiple other substrates 402 in multiple planes of orientation.

Example Methods

Figure 11:
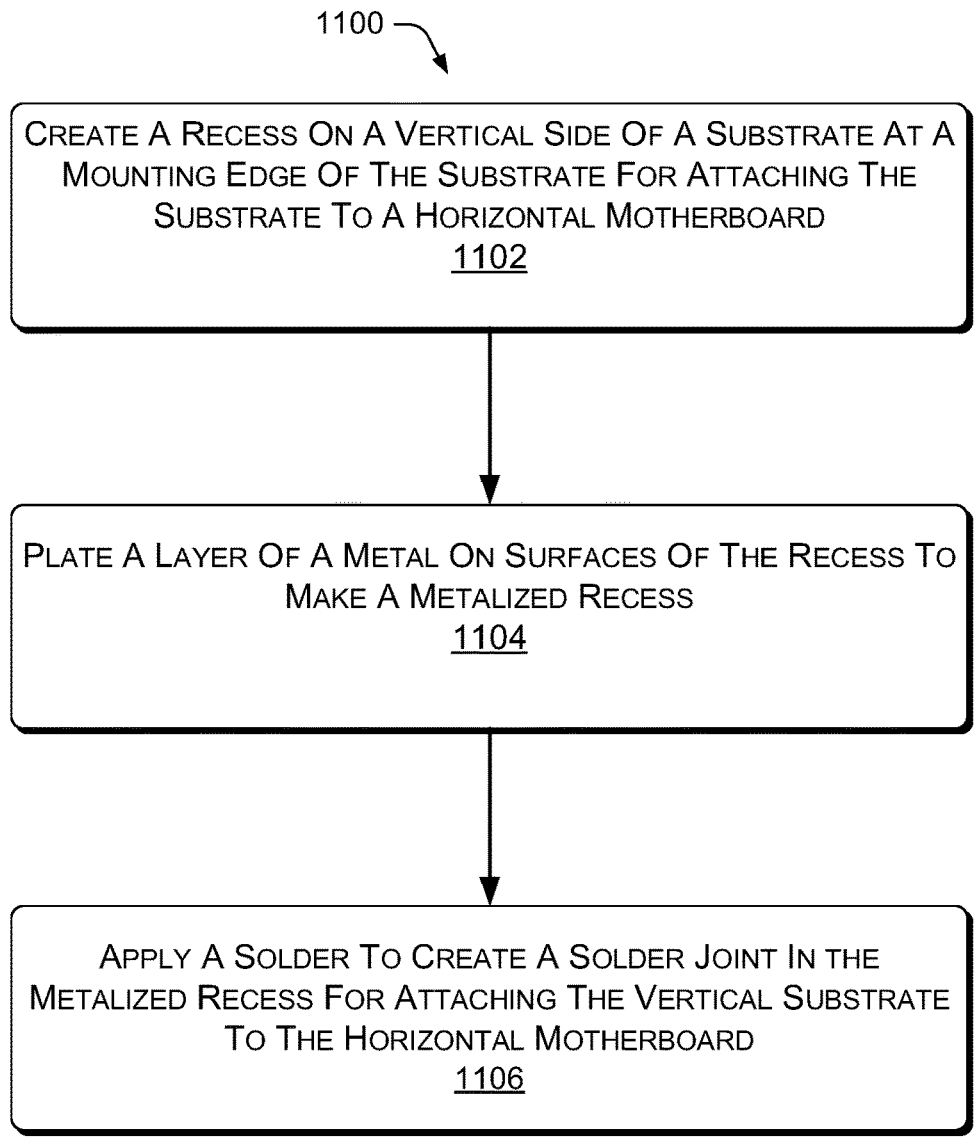
FIG. 11 is a flow diagram of an example method of vertically attaching a substrate to a horizontally disposed motherboard.

FIG. 11 shows an example method 1100 of vertically attaching a substrate to a horizontally disposed motherboard. Operations of the example method 1100 are shown in individual blocks.

At block 1102, a recess is created on a vertical side of the substrate at a mounting edge of the substrate, the vertical side for mounting an electronic component or a circuit, the mounting edge for attaching the substrate to the horizontally disposed motherboard.

At block 1104, a layer of a metal is plated onto surfaces of the recess to make a metalized recess, the metalized recess capable of electrically connecting to the electronic component or to the circuit on the vertical side.

At block 1106, a solder is applied to create a solder joint in the metalized recess for attaching the substrate to the motherboard. At least part of the solder in the metalized recess is within a horizontal cross-sectional profile of the substrate, that is, underneath the attachment edge of the substrate, between the substrate and the motherboard. This is different than a conventional solder joint for vertical mounting, which has the solder merely adjacent to the joining edge of the substrate.

The recess further provides additional surfaces and additional surface area for soldering the substrate to the motherboard. The recess also creates space for an additional volume of solder, for soldering the substrate to the motherboard.

Applying the solder creates a shape profile of the solder that can increase the strength and reduce the internal stress of the solder joint between the substrate and the motherboard. The shape profile of the solder can include both volume components and shape components of the solder joint in the metalized recess.

The shape of the solder joint, based on the shape of the metalized recess, can by one of a rectangular prism, a rectangle prism with at least two rounded edges or corners, a cube, a cube with at least two rounded edges or corners, an arched shape, semicircular shape, a trough shape, an ovaline shape, a semi-ovaline shape, an ellipsoid shape, a conic shape, a triangular shape, or a dumbbell shape, for example.

The soldering may further form an electrical connection between the electronic component or circuit on the vertical surface of the substrate and an endpoint of a circuit on the motherboard, with the metalized recess and solder as electrical intermediary.

At least one recess can be created on each of both vertical sides of the substrate at the mounting edge of the substrate. Then, a solder is applied to the metalized recesses on both sides of the substrate for soldering the substrate to the motherboard. An electrical connection may be formed via the soldering between one or more electronic components or circuits on respective vertical surfaces of the substrate and respective endpoints of circuits on either side of the substrate on the motherboard.

Multiple of the recesses, on one or more sides of the substrate, may be different shapes, and different offsets from each other. The recesses may also be different depths, sizes, or shapes.

The method may also include creating one or more through-holes through the substrate between two vertical sides of the substrate at a mounting edge of the substrate. A layer of a metal is applied or plated on surfaces of the through-hole to make a metalized through-hole electrically connected to an electronic component or a circuit on each vertical side of the substrate. Solder may then be applied to the metalized through-hole for soldering the substrate to the motherboard. Applying the solder to the metalized through-hole for soldering the substrate to the motherboard electrically may connect components of the substrate to a common power circuit, a common ground circuit, or a common signal circuit of the motherboard on both sides of the mounted substrate.

The method may further include electrically connecting a component, connector, circuit, ground plane, power plane, coil, inductor, filter, capacitor plate, antenna, or interference shield on a first vertical surface of the substrate with a component, connector, circuit, ground plane, power plane, coil, inductor, filter, capacitor plate, antenna, or interference shield on a second vertical surface of the substrate via the metalized through-hole.

The recess or the through-hole may be formed in the substrate by punching, drilling, end-drilling, laser-drilling, cutting, etching, or plasma etching the recess or the through-hole in the substrate. Each recess or cutout created is then seeded and metalized with a layer of plated metal copper or other conductor.

In an implementation, at least one recess is created in a surface of the substrate midway along a length of the substrate. The substrate is cut crosswise through the recess into two substrates, each substrate having approximately half of the at least one recess at a mounting edge of each substrate for vertically mounting each substrate to the motherboard. A solder is applied to the metalized surface area in the recess to create an increased electrical current capacity of the solder joint, as compared with conventional solder joints for vertical mounts. The increased amount of solder provides an increased data signal capacity of the solder joint.

Recesses may be created on one or more vertical sides of the substrate at multiple mounting edges of the substrate, and the recesses of the multiple mounting edges soldered to one or more motherboards or other substrates in multiple planes of orientation.

In the specification and appended claims: the terms "connect," "connection," "connected," "in connection with," and "connecting," are used to mean "in direct connection with" or "in connection with via one or more elements." The terms "couple," "coupling," "coupled," "coupled together," and "coupled with," are used to mean "directly coupled together" or "coupled together via one or more elements."

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. A laminate-based chip package, comprising:
an organic or inorganic core substrate;
first and second vertical surfaces of the core substrate for mounting die or chips;
a horizontal surface of an edge of the core substrate for mounting to a motherboard;
die or chips adhered or bonded to the first and/or second vertical surfaces of the core substrate;
a dielectric laminated on the die or chips and the core substrate;
electrical contact pads on the first and second vertical surfaces of the core substrate for electrically connecting to the motherboard at the edge of the core substrate;
at least an electrical connection between the die or chips and at least some of the respective electrical contact pads on each side of the laminate-based chip package;
multiple recesses each comprising a space formed in the electrical contact pads into the core substrate at a depth, each recess providing additional surfaces and additional surface area of the core substrate for bonding to the motherboard;
the recesses metalized for soldering and to electrically connect with respective electrical contact pads;
wherein each instance of the metalized recess formed into the core substrate at a location of a corresponding electrical contact pad at the edge of the core substrate comprises a multi-surface edge pad;
each multi-surface edge pad comprising an overhang providing a hook, clasp, spike, or anchor to physically secure at least part of the multi-surface edge pad to a respective solder joint; and
a solder, the solder forming each respective solder joint in at least each of the metalized recesses and each overhang to connect the additional surfaces and the additional surface area of each multi-surface edge pad to the motherboard.

2. The laminate-based chip package of claim 1, wherein the solder is disposed under a horizontal surface of each multi-surface edge pad and above a horizontal surface of the motherboard.

3. The laminate-based chip package of claim 1, further comprising an underfill disposed under a horizontal surface of each multi-surface edge pad and above a horizontal surface of the motherboard.

4. The laminate-based chip package of claim 1, wherein an amount of the solder and a configuration of the solder in each multi-surface edge pad reduces a stress of the solder joint by approximately 50%.

5. The laminate-based chip package of claim 1, wherein a thickness of the core substrate is between approximately 50-500μ (microns).

6. The laminate-based chip package of claim 1, further comprising a plurality of laminate layers of the core substrate, each laminate layer including the multi-surface edge pads comprising the recesses for joining the plurality of laminate layers to the motherboard.

7. The laminate-based chip package of claim 6, wherein each laminate layer has a thickness of approximately 20-25μ (microns), and the plurality of laminate layers has a total thickness of approximately 100-200μ (microns) for bismaleimide-triazine resin (BT) materials, and approximately 200-800μ (microns) for printed circuit board (PCB) materials.

8. The laminate-based chip package of claim 1, wherein the solder comprises a dipped layer of the solder to wet the multi-surface edge pads, and a flowed solder to add a volume of the solder to the solder joint.

9. The laminate-based chip package of claim 8, wherein the solder is printed onto the core substrate.

10. The laminate-based chip package of claim 1, wherein a shape of the recess is selected from the group consisting of a rectangular prism, a rectangle prism with at least two rounded edges or corners, a cube, a cube with at least two rounded edges or corners, an arched shape, semicircular shape, a trough shape, an ovaline shape, a semi-ovaline shape, an ellipsoid shape, a conic shape, a triangular shape, and a dumbbell shape.

11. The laminate-based chip package of claim 1, wherein at least some of the recesses have different shapes from each other or have different offsets from each other, the offsets comprising distances from a same surface of the core substrate.

12. The laminate-based chip package of claim 1, further comprising creating at least one recess on each of two vertical sides of the core substrate at a mounting edge of the core substrate to provide dual-side multi-surface edge pads on the core substrate;

the solder applied to the metalized recesses on the two vertical sides of the core substrate for soldering the core substrate to the motherboard; and an electrical connection formed via the soldering between one or more electronic components or circuits on respective vertical surfaces of the substrate and respective endpoints of circuits on either side of the substrate on the motherboard.

13. The laminate-based chip package of claim 1, further comprising a through-hole at a multi-surface edge pad, the through-hole created through the core substrate between two vertical sides of the core substrate at a mounting edge of the core substrate, each vertical side of the substrate for mounting the electronic components or circuits;

a layer of a metal deposited on a surface of the through-hole to make a metalized through-hole electrically connected to an electronic component or a circuit on each vertical side of the core substrate; and the solder applied to the metalized through-hole for soldering the substrate to the motherboard.

14. The laminate-based chip package of claim 1, further comprising the multi-surface edge pads formed on one or more vertical sides of the substrate at multiple mounting edges of the substrate; and the solder attaching the multiple mounting edges to one or more motherboards or multiple other substrates in multiple planes of orientation.

* * * * *